US010910538B2

(12) United States Patent
Varghese

(10) Patent No.: US 10,910,538 B2
(45) Date of Patent: Feb. 2, 2021

(54) OPTOELECTRONIC SEMICONDUCTOR COMPONENT AND METHOD FOR PRODUCING AN OPTOELECTRONIC SEMICONDUCTOR COMPONENT

(71) Applicant: OSRAM Opto Semiconductors GmbH, Regensburg (DE)

(72) Inventor: Tansen Varghese, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 4 days.

(21) Appl. No.: 16/476,863

(22) PCT Filed: Jan. 23, 2018

(86) PCT No.: PCT/EP2018/051568
§ 371 (c)(1),
(2) Date: Jul. 9, 2019

(87) PCT Pub. No.: WO2018/138080
PCT Pub. Date: Aug. 2, 2018

(65) Prior Publication Data
US 2019/0363234 A1    Nov. 28, 2019

(30) Foreign Application Priority Data
Jan. 24, 2017  (EP) .................................... 17152858

(51) Int. Cl.
*H01L 33/62* (2010.01)
*H01L 25/075* (2006.01)
(Continued)

(52) U.S. Cl.
CPC ............ *H01L 33/62* (2013.01); *H01L 25/075* (2013.01); *H01L 33/005* (2013.01); *H01L 33/08* (2013.01)

(58) Field of Classification Search
CPC ....... H01L 33/08; H01L 25/075; H01L 33/40; H01L 33/42
See application file for complete search history.

(56) References Cited

U.S. PATENT DOCUMENTS

| 2008/0036038 A1 | 2/2008 | Hersee et al. |
| 2014/0246647 A1 | 9/2014 | Cha et al. |
| 2016/0300983 A1 | 10/2016 | Strassburg et al. |

FOREIGN PATENT DOCUMENTS

| KR | 20150085348 A | 7/2015 |
| WO | 2012060335 A1 | 5/2012 |
| WO | 2015091754 A1 | 6/2015 |

OTHER PUBLICATIONS

Liu, Q.Z. et al., "A Review of the Metal-GaN Contact Technology," Solid State Electronics, vol. 42, No. 5, 1998, 15 pages.

*Primary Examiner* — John A Bodnar
(74) *Attorney, Agent, or Firm* — Slater Matsil, LLP

(57) ABSTRACT

An optoelectronic semiconductor component and a method for producing an optoelectronic semiconductor component are disclosed. In an embodiment an optoelectronic semiconductor component includes a plurality of active regions configured to emit electromagnetic radiation, wherein the active regions are arranged spaced apart from each other, wherein the active regions have a main extension direction, wherein each active region has a core region, an active layer covering the core region at least in directions transverse to the main extension direction, wherein each active region has a cover layer covering the active layer at least in directions transverse to the main extension direction, wherein each active region has a current spreading layer at least partly covering sidewalls of each respective active region, and wherein a metal layer directly adjoins parts of the active regions and parts of the current spreading layers.

14 Claims, 5 Drawing Sheets

(51) Int. Cl.
*H01L 33/08* (2010.01)
*H01L 33/00* (2010.01)

OPTOELECTRONIC SEMICONDUCTOR COMPONENT AND METHOD FOR PRODUCING AN OPTOELECTRONIC SEMICONDUCTOR COMPONENT

This patent application is a national phase filing under section 371 of PCT/EP2018/051568, filed Jan. 23, 2018, which claims the priority of European patent application 17152858.1, filed Jan. 24, 2017, each of which is incorporated herein by reference in its entirety.

TECHNICAL FIELD

The application is directed to an optoelectronic semiconductor component having a plurality of active regions which are spaced apart from each other, wherein the active regions can be formed as micro- or nanorods, and a method for producing the optoelectronic semiconductor component.

BACKGROUND

An optoelectronic semiconductor component having a multiplicity of active regions which are spaced apart from each other is known, for example, from the International Application Publication WO 2015/091754 A1. The document describes a current spreading layer disposed on the multiplicity of the active regions for making electrical contact and spreading the current over the multiplicity of active regions.

The document Q. Z. Liu, S. S. Lau, "A review of the metal-GaN contact technology," Solid State Electronics 42 (5) 1998, p. 677-691, describes the Schottky barrier formation at metal-GaN interfaces.

SUMMARY OF THE INVENTION

Embodiments provide an improved optoelectronic semiconductor component, in particular an optoelectronic semiconductor component with increased the brightness. Further embodiments provide a method for producing the optoelectronic semiconductor component.

According to at least one embodiment of the optoelectronic semiconductor component, the optoelectronic semiconductor component comprises a plurality of active regions. The active regions are each configured for generating electromagnetic radiation. For example, during operation, the active regions generate light in the UV spectral range and/or in the visible spectral range, in particular visible light. The optoelectronic semiconductor component can comprise in particular a hundred or more active regions or a thousand or more active regions. The active regions are, for example, connected to each other in an electrically conductive manner such that at least 50% of the active regions, in particular at least 75%, or even all of the active regions, generate the electromagnetic radiation at the same time during operation.

According to at least one embodiment of the optoelectronic semiconductor component, the plurality of active regions is arranged spaced apart from each other. That is to say, the active regions do not contact each other at least in regions but rather are formed as mutually separate regions at least in regions. The active regions can be arranged spaced apart from each other at least in regions, for example, in lateral directions which extend in parallel with a main extension plane of the optoelectronic semiconductor component. The active regions can thereby be connected together, e.g., at their base surfaces or their cover surfaces by a common material or a common carrier. However, in particular, the regions of the active regions which emit electromagnetic radiation during operation of the optoelectronic semiconductor component are arranged spaced apart from each other.

The active regions can each have a main extension direction z. The main extension directions of a majority, e.g., of all active regions, can extend in parallel with each other within manufacturing tolerances. The main extension direction then extends, e.g., transversely or perpendicularly to the lateral directions, in which the active regions are arranged spaced apart from each other.

The active regions preferably have a core region which can comprise a first semiconductor material. The active regions can be connected to each other in each case at a base surface of the active regions via this first semiconductor material.

According to at least one embodiment of the optoelectronic semiconductor component, the active regions have an active layer which covers the core region at least in directions transverse to the main extension direction of the active region. That is to say, the active layer can be formed on peripheral surfaces and, if applicable, also on cover surfaces of the core regions and can cover the core region at that location. In particular, it is also possible, however, that base surfaces and/or cover surfaces of the core regions are each free of the active layer and merely peripheral surfaces of the core regions are covered by the active layer.

According to at least one embodiment of the optoelectronic semiconductor component, the active regions comprise a cover layer which covers the active layer at least in directions transverse to the main extension direction z of the active region. The cover layer can be formed, for example, with a second semiconductor material. The second semiconductor material can differ from the first semiconductor material in particular in its doping.

On the whole, it is thus possible that a majority, in particular all, of the active regions each have a core region which is covered in each case by an active layer in directions transverse to the main extension direction of the active region, which active layer is in turn covered by a cover layer in each case in particular also in directions transverse to the main extension direction of the active region.

The active regions are based on a nitride compound semiconductor material. The core region, the active layer and the cover layer are preferably each based on a nitride compound semiconductor material. The nitride compound semiconductor materials preferably each comprise $In_xAl_yGa_{1-x-y}N$ with $0 \leq x \leq 1$, $0 \leq y \leq 1$ and $x+y \leq 1$. Preferably, the core region comprises an n-type nitride semiconductor material, and the cover layer comprises a p-type nitride semiconductor material.

The active regions can thereby be in particular so-called nanorods or microrods, in which a shell having an active layer is applied around a core which extends in all three spatial directions. In particular, these are core shell nanorods or core shell microrods.

The active regions have a diameter, as measured in lateral directions, of e.g., between at least 100 nm and at the most 5 µm. In the main extension direction, the active regions have a length which is larger than the diameter. For example, the length of the active regions is at least twice as large as the diameter, in particular at least five times as large as the diameter, or even at least 20 times as large as the diameter of the active regions.

In various embodiments the optoelectronic semiconductor component having a plurality of active regions is characterized in particular in that owing to the plurality of active regions which extend along a main extension direction, the radiation-emitting surface of the optoelectronic semiconductor component is enlarged.

According to at least one embodiment of the optoelectronic semiconductor component, each active region has a current spreading layer comprising a transparent conductive oxide.

The current spreading layer at least partly covers sidewalls of the respective active region and is in electrical contact with the cover layer. In particular, the current spreading layer can be in direct contact with the cover layer of the active regions. The current spreading layer particularly has the function of spreading current along the sidewalls of the active regions.

According to at least one embodiment of the optoelectronic semiconductor component, a metal layer directly adjoins part of the surface regions of the active regions and makes electrical contact with the current spreading layer.

According to at least one embodiment, an optoelectronic semiconductor component is provided comprising a plurality of active regions configured to emit electromagnetic radiation, comprising a plurality of active regions configured to emit electromagnetic radiation, wherein the active regions—are arranged spaced apart from each other, —have a main extension direction z, —have a core region, an active layer covering the core region at least in directions transverse to the main extension direction z of the active region, and—have a cover layer which covers the active layer at least in directions transverse to the main extension direction z of the active region. Each active region has a current spreading layer at least partly covering sidewalls of the respective active region, wherein each of the current spreading layers comprises a transparent conductive oxide and is in electrical contact with the cover layer. A metal layer directly adjoins part of the active regions and part of the current spreading layers, wherein the metal layer electrically interconnects the current spreading layers of the active regions.

In the optoelectronic component described herein, the metal layer is used for spreading current over the plurality of active regions. On the other hand, the current spreading layers of the active regions comprising the transparent conductive oxide are only for current spreading along the sidewalls of the active regions. This advantageously allows the current spreading layer to be very thin, thereby reducing absorption in the current spreading layer.

According to at least one embodiment of the optoelectronic semiconductor component, the current spreading layer has a thickness of less than 30 nm. A thickness of less than 30 nm is preferred in order to reduce absorption in the current spreading layer. The thickness of the current spreading layer can be particularly in the range between 1 nm and 30 nm.

According to at least one embodiment of the optoelectronic semiconductor component, the current spreading layer can comprise indium tin oxide (ITO) or aluminum-doped zinc oxide (AZO).

According to at least one embodiment of the optoelectronic semiconductor component, the metal layer comprises a metal that is suited to form an Ohmic contact with the current spreading layer. In particular, the metal layer forms an Ohmic contact with a transparent conductive oxide of the current spreading layer. On the other hand, the metal of the metal layer is not suited to form an Ohmic contact with the core region. In particular, the metal layer comprises a metal that forms a Schottky barrier at the interface between the core regions of the active regions and the metal layer. In this way, it is possible for the metal layer to cover all over the top regions of the plurality of active regions including the core regions without causing a short-circuit between the core regions and the cover layers. The higher the Schottky barrier, the lower is a leakage current. The Schottky barrier formation of different metal materials on n-GaN is known from the document Q. Z. Liu, S. S. Lau, "A review of the metal-GaN contact technology", Solid State Electronics 42 (5) 1998, p. 677-691, the disclosure content being herewith incorporated by reference regarding the Schottky barrier formation at metal-GaN interfaces. Suitable metals for forming a Schottky barrier to a nitride semiconductor material are in particular Ag, Au, Pd, Ni and Pt.

By virtue of the metal layer making no Ohmic contact with the core regions of the active regions, it is advantageously possible to deposit the metal layer all over the top regions of the active regions without using a mask.

According to at least one embodiment of the optoelectronic semiconductor component, the current spreading layers of the active regions are separated from one another and are electrically interconnected by the metal layer.

According to at least one embodiment of the optoelectronic semiconductor component, the metal layer comprises a highly reflecting metal. Preferably, the metal layer comprises silver. In addition to its function as a current spreader, the metal layer can have the function of reflecting part of the emitted radiation to a radiation exit surface of the optoelectronic component.

According to at least one embodiment of the optoelectronic semiconductor component, a transparent dielectric layer is arranged between the active regions, and wherein part of the transparent dielectric layer, part of the current spreading layer and part of the active regions form a planar surface on which the metal layer is applied.

The optoelectronic semiconductor chip comprises a radiation exit surface, through which electromagnetic radiation generated in the plurality of active regions is emitted. The radiation exit surface can be provided with an outcoupling structure or a roughening. The metal layer is advantageously arranged at a side of the active regions facing away from the radiation exit surface. In this case, the metal layer advantageously functions as a mirror layer.

Furthermore, the optoelectronic semiconductor chip advantageously comprises an n-contact and a p-contact, wherein the p-contact is arranged at a side of the mirror layer facing away from the radiation exit surface.

The luminous efficiency of the optoelectronic semiconductor chip is advantageously increased further by virtue of the fact that the metal layer is arranged at a side of the semiconductor layer sequence facing away from the radiation exit surface. The electromagnetic radiation which is generated in the active regions and which is emitted in the direction of a rear side of the semiconductor chip, said rear side being situated opposite the radiation exit surface, is reflected toward the radiation exit surface by the metal layer. By virtue of the fact that the p-contact with which the semiconductor layer sequence is electrically contacted is arranged at a side of the mirror layer facing away from the radiation exit surface, the radiation exit surface of the optoelectronic semiconductor chip is advantageously free of electrical contacts and/or bonding wires. Absorption of radiation by contact layers on the radiation exit surface is advantageously avoided in this way and the luminous efficiency is thus increased further.

According to at least one embodiment, the optoelectronic semiconductor component is a flip-chip light emitting diode chip. At the n-contact and the p-contact, the optoelectronic semiconductor component is advantageously mountable onto a surface. By way of example, at the electrical contacts the optoelectronic semiconductor chip can be connected to a printed circuit board, in particular soldered onto a printed circuit board. It is also possible for the optoelectronic semiconductor chip to be connected to a leadframe of a chip housing, for example, of a reflector housing, at the n-contact and p-contact. The optoelectronic semiconductor chip is in particular a surface-mountable semiconductor chip.

According to at least one embodiment, the optoelectronic semiconductor component is a light emitting diode chip having no growth substrate. In particular, the growth substrate can be removed from the semiconductor layer sequence forming the active regions, e.g., by a Laser-Lift-Off method.

According to at least one embodiment of the optoelectronic semiconductor component, the active regions are microrods or nanorods having a lateral extent between 20 nm and 5 µm, preferably between at least 100 nm and at most 5 µm.

A method for producing an optoelectronic semiconductor component is also provided. An optoelectronic semiconductor component described herein can be produced by means of a method described herein. That is to say that all of the features disclosed for the optoelectronic semiconductor component are also disclosed for the method, and vice versa.

According to at least one embodiment, the method for producing the optoelectronic semiconductor component comprises growing the active regions on a growth substrate. Before growing the active regions, at least one first semiconductor layer can be grown on the growth substrate, in particular an n-type semiconductor layer. The n-type semiconductor layer is preferably an n-type nitride layer, in particular an n-GaN layer. The n-type semiconductor layer preferably acts as a common contact for the core regions of the active regions.

According to at least one embodiment, a current spreading layer comprising a transparent conductive oxide is deposited on the active regions in a further method step. After deposition, the transparent conductive oxide can completely cover the active regions.

According to at least one embodiment, the current spreading layer is removed from part of the active regions by etching. In particular, the current spreading layer is removed from the top regions of the active regions.

According to at least one embodiment, a transparent dielectric layer is applied over the active regions and the current spreading layer. The transparent dielectric layer can be a silicon oxide layer, for example.

According to at least one embodiment, part of the transparent dielectric layer, part of the current spreading layer and part of the active regions are mechanically removed in a further method step. In this way, an exposed surface having exposed parts of the current spreading layer and of the active regions is produced.

According to at least one embodiment, the metal layer is applied on the exposed surface in a further method step. The metal layer makes electrical contact with the current spreading layer of the active regions.

According to at least one embodiment, mechanically removing part of the transparent dielectric layer, part of the current spreading layer and part of the active regions comprises polishing. The metal layer is then deposited on the polished surface.

According to at least one embodiment, the method step of removing the current spreading layer comprises removing the current spreading layer also from regions of an insulation layer between the active regions. In this way, it is possible to further reduce absorption caused by the current spreading layer.

According to at least one embodiment, the method further comprises removing the growth substrate. This can be done, for example, by a Laser-Lift-Off process.

BRIEF DESCRIPTION OF THE DRAWINGS

The optoelectronic semiconductor component described herein and the method described herein will be explained in more detail hereinafter with the aid of exemplified embodiments and the associated figures.

In the figures.

Identical or identically acting component parts are provided with the same reference signs in each case in the figures. The illustrated component parts and the size relationships of the component parts among one another should not be regarded as true to scale.

DETAILED DESCRIPTION OF ILLUSTRATIVE EMBODIMENTS

Figure 1A:
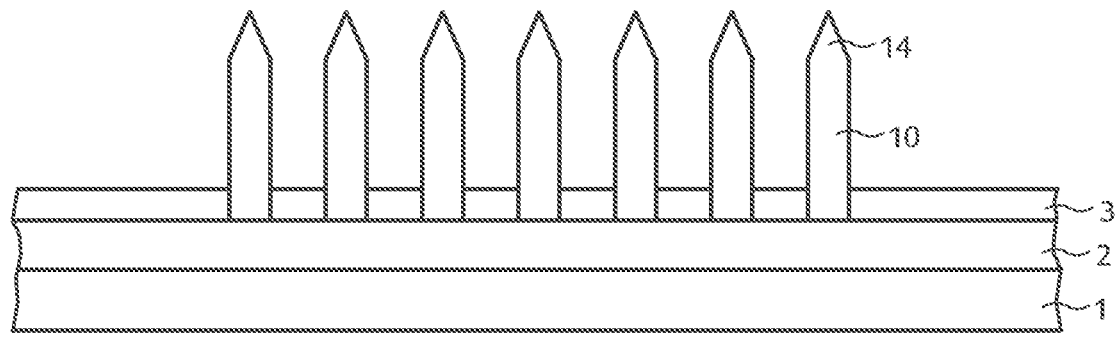
FIGS. 1 to 9 show; schematic illustrations of exemplary embodiments of the method for producing the optoelectronic semiconductor chip on the basis of intermediate steps.

A method step of an exemplified embodiment of a method described herein is explained in more detail in conjunction with the schematic sectional illustration in FIG. 1A.

In the method, a multiplicity of active regions 10 is provided. The active regions 10 are arranged spaced apart from each other over a common substrate 1. For simplification only seven active regions 10 are shown in FIG. 1A. The total number of active regions 10 in the optoelectronic semiconductor component can be, for example, at least 50, at least 100 or even at least 500. The active regions 10 can have a matrix-type arrangement on the substrate 1. The substrate 1 is preferably a transparent substrate, in particular a sapphire substrate.

The multiplicity of active regions 10 is preferably electrically interconnected by a first semiconductor layer 2. The first semiconductor layer 2 is particularly an n-type semiconductor layer. For example, the first semiconductor layer 2 comprises n-doped GaN.

The active regions 10 can be epitaxially grown on the first semiconductor layer 2. An insulation layer 3 is formed on the lower sides of the active regions 10 at the location where they are connected together via the first semiconductor layer 2, which insulation layer 3 can also be used as a mask for generating the active regions 10 during the epitaxial growth. However, the insulation layer 3 does not have to correspond to a growth mask and can also be introduced subsequently—that is to say upon completion of the epitaxial growth. The insulation layer 3 is formed, for example, with a semiconductor oxide or a semiconductor nitride such as silicon oxide or silicon nitride.

Figure 1B:
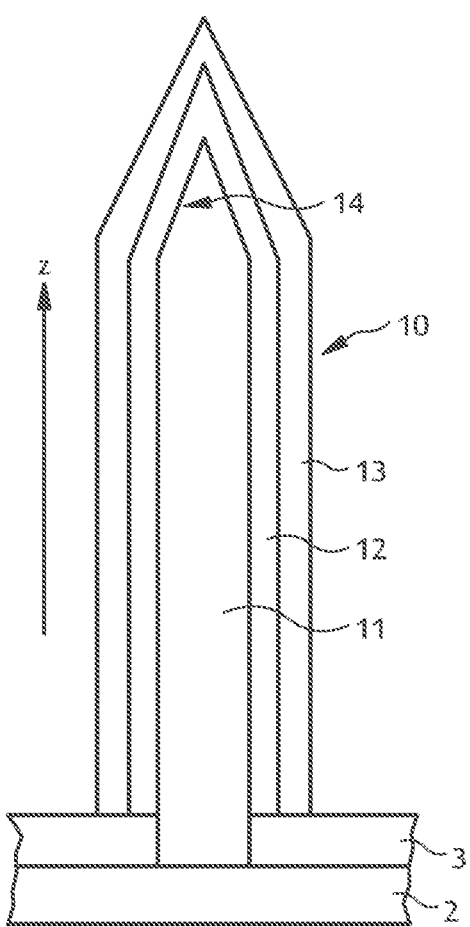

The active regions 10 are particularly formed as microrods or nanorods. In FIG. 1A, the active regions 10 are only depicted schematically without showing their internal structure. An enlarged view of an active region 10 is shown in FIG. 1B. The active region 10 has a main extension direction z, along which it extends. The active region 10 is preferably formed longer in the main extension direction z than it is wide in lateral directions, transverse or perpendicular to the main extension direction z. The active regions 10 have a diameter, as measured in lateral directions, of e.g., between at least 100 nm and 5 µm. In the main extension direction z, the active regions 10 have a length which is larger than the diameter. For example, the length of the active regions 10 is at least twice as large as the diameter, in particular at least five times as large as the diameter, or even at least 20 times as large as the diameter of the active regions 10.

The top regions 14 of the active regions 10 can have a tapered cross section which tapers in the main extension direction of the active regions 10. In particular, the active regions 10 can have a tip on top. The top regions 14 can, for example, be embodied as hexagonal pyramids or as truncated hexagonal pyramids.

Each active region 10 includes a core region 11 which is formed with a first semiconductor material which is, for example, an n-conductive GaN. The core region is completely covered by an active layer 12 which is provided for generating electromagnetic radiation and is based, e.g., on InGaN. The active layer 12 is covered by a cover layer 13 which is formed, for example, with a second semiconductor material. The cover layer 12 can be formed, for example, with p-doped GaN.

The semiconductor layers 2, 11, 12, 13 are preferably each based on a nitride compound semiconductor material. The nitride compound semiconductor materials preferably each comprise $In_xAl_yGa_{1-x-y}N$ with $0 \leq x \leq 1$, $0 \leq y \leq 1$ and $x+y \leq 1$. The nitride compound semiconductor material need not necessarily have a mathematically exact composition according the above formula. Instead, it may comprise one or more dopants and additional constituents which do not substantially modify the characteristic physical properties of the $In_xAl_yGa_{1-x-y}N$ material. For simplicity's sake, however, the above formula includes only the fundamental constituents of the crystal lattice (In, Al, Ga, N), even if these may in part be replaced by small quantities of further substances.

For example, the core region 11 comprises n-doped GaN, the active layer 12 comprises InGaN and the cover layer 13 comprises p-doped GaN. The core region 11, the active layer 12 and/or the cover layer 13 can comprise a single layer or a plurality of partial layers. In particular, the active region 12 can comprise a single quantum well structure or a multiple quantum well structure.

The insulation layer 3 preferably insulates the first semiconductor layer 2 from the active layer 12 and the cover layer 13.

Figure 1C:
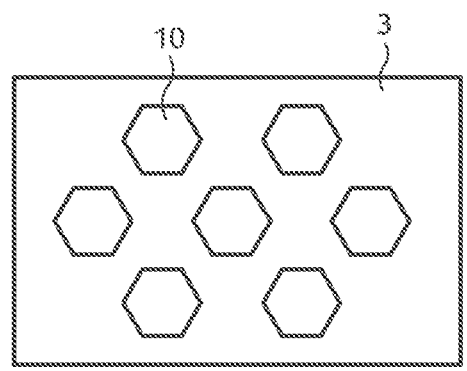

FIG. 1C schematically shows a top view of some of the active regions 10. The active regions 10 can have, for example, hexagonal shaped base areas. Alternatively, other forms of the base area are also possible.

Figure 2:
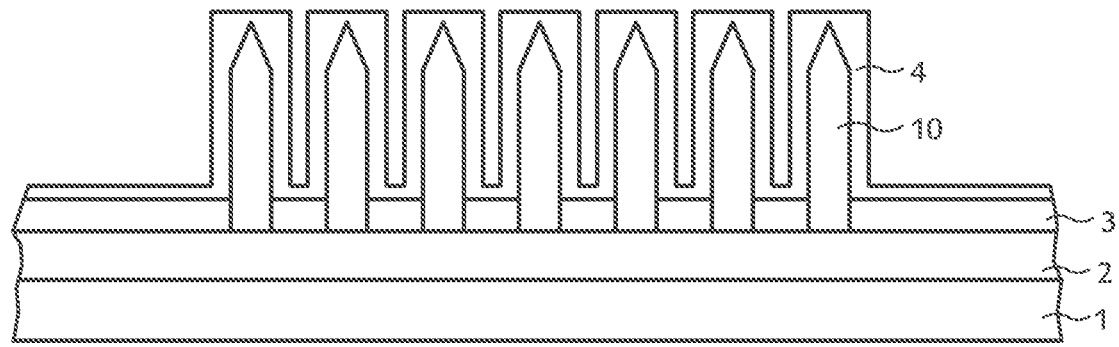

In a method step which is schematically shown in FIG. 2, a current spreading layer 4 is applied over the active regions 10. The current spreading layer 4 comprises a transparent conductive oxide (TCO). In particular, the current spreading layer 4 comprises ITO or AZO.

Figure 3:
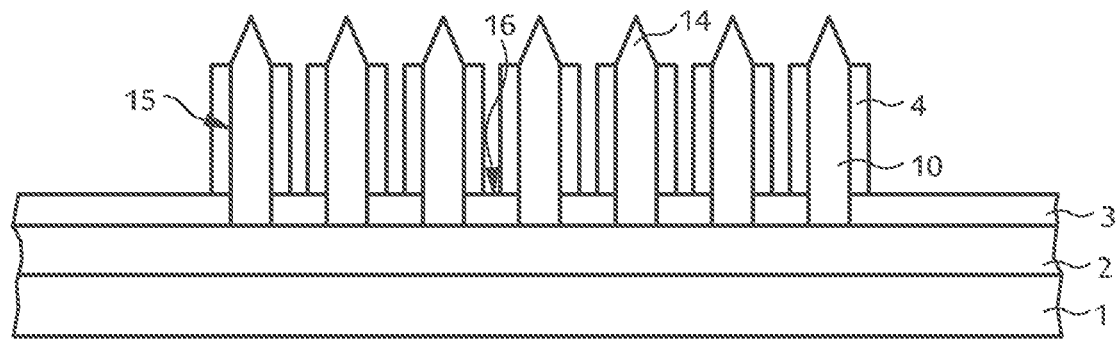

In a further method step which is schematically shown in FIG. 3, an etching process is carried out for removing the current spreading layer 4 from the top regions 14 of the active regions 10 and from regions 16 of the insulation layer 3 which are between the active regions 10. This method step is preferably be done by a dry etching process, in particular an anisotropic dry etching process. After this method step, the current spreading layer 4 covers only the sidewalls 15 of the active regions 10. The thickness of the current spreading layer 4 on the sidewalls 15 is advantageously no more than 30 nm. The current spreading layer 4 is advantageously also removed from regions 16 of the insulation layer 3, wherein the regions 16 are between the active regions 10.

Figure 4:
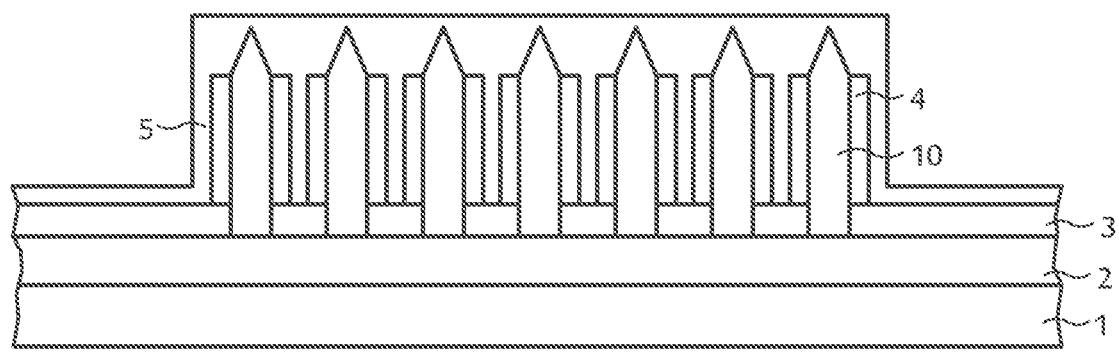

In a further method step which is schematically shown in FIG. 4, a transparent dielectric layer 5 is applied over the active regions 10. The active regions 10 are preferably completely encased by the transparent dielectric layer 5. In particular, the transparent dielectric layer 5 fills up the spaces between the active regions 10. The transparent dielectric layer 5 can be, for example, a silicon oxide layer. Depending on the wavelength of the emitted radiation and the absorption coefficient of the dielectric material at the emission wavelength, other materials are also suitable for the transparent dielectric layer 5. In particular, the transparent dielectric layer 5 can comprise an oxide or nitride of Ti, Si, Hf, Ta, Nb, Al or Zr. It is also possible that the transparent dielectric layer comprises a thermoplastic material such as hardened silicone or a thermosetting material having a low enough absorption.

Figure 5:
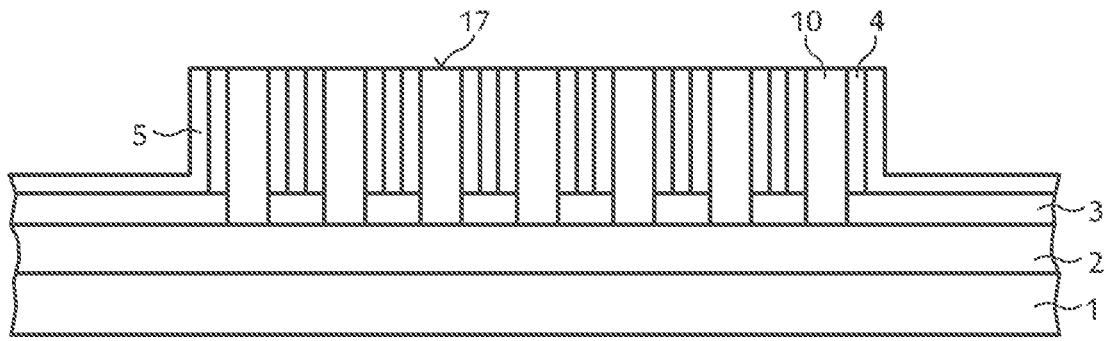

In a further method step which is schematically shown in FIG. 5, part of the transparent dielectric layer 5 and the top regions 14 of the active regions 10 are removed. This is done by a material removal process, in particular by a mechanical material removing process. Preferably, the material is removed by polishing. On the exposed surface 17 produced in this way, part of the active regions 10, part of the current spreading layer 4 and part of the transparent dielectric layer 5 are exposed.

Figure 6:
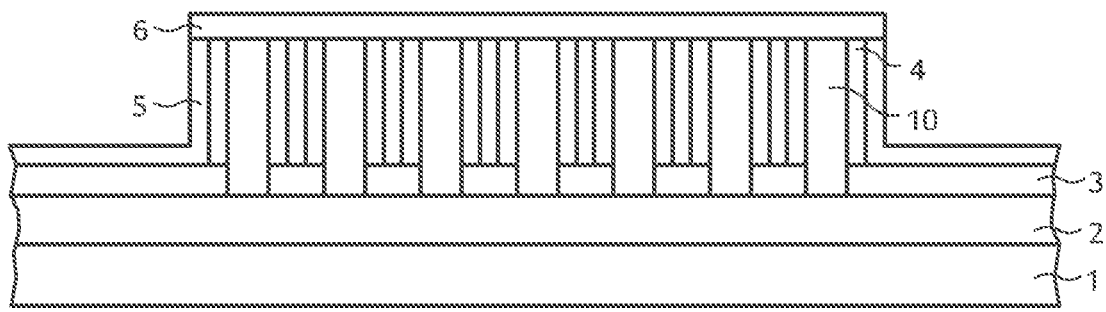

In a further method step which is schematically shown in FIG. 6, a metal layer 6 is applied on the exposed surface which has been produced by the polishing process. The metal layer 6 comprises a material that forms an ohmic contact to the exposed regions of the current spreading layer 4. However, the material the metal layer 6 is chosen so that the metal does not make an ohmic contact to the exposed surfaces of the core regions 11 of the active regions 10. On the contrary, the metal contact 6 forms a Schottky barrier to the core regions 11 of the active regions 10. A suitable metal for forming a Schottky barrier to the n-doped nitride semiconductor material of the core regions 11 is in particular silver. Other suitable metals for forming a Schottky barrier to the core regions are in particular Au, Pd, Ni and Pt.

An advantage of using silver for the metal layer 6 is that silver has a high reflectivity over a wide spectral range, in particular in the visible spectral range. This is particularly advantageous if the optoelectronic semiconductor component produced by the method is a flip-chip type light emitting diode chip which has a main emission direction that is reverse to the growth direction of the semiconductor layers. In particular, the main emission direction of the optoelectronic semiconductor component can be in the direction to the growth substrate 1.

Figure 7:
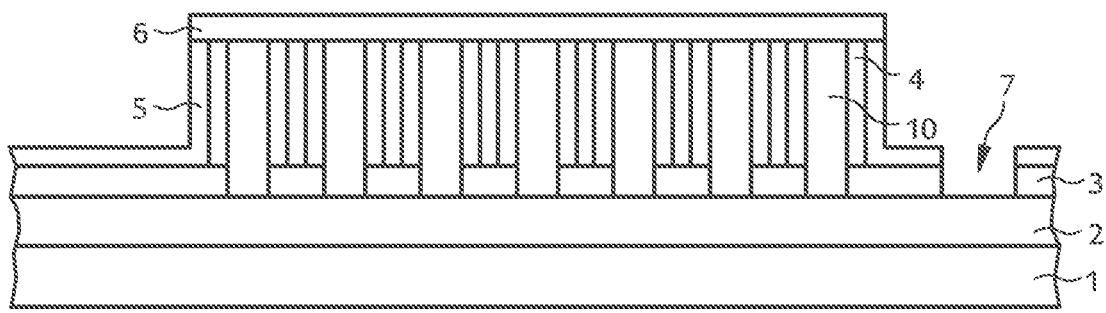

In a further method step which is schematically shown in FIG. 7, an opening 7 is formed in the transparent dielectric layer 5 and the insulation layer 3 in order to expose part of the first semiconductor layer 2. This can be done by an etching process that stops at the first semiconductor layer 2 which can be in particular an n-type semiconductor layer, preferably n-GaN.

Figure 8:
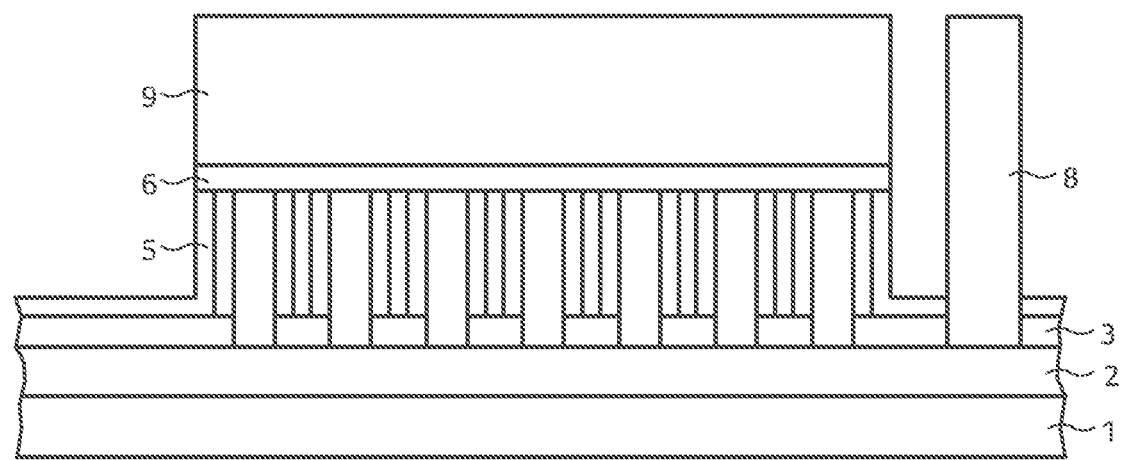

In a further method step which is schematically shown in FIG. 8, an n-contact 8 is formed in the opening produced in the previous method step. In addition, a p-contact 9 is formed on the metal layer 6.

Figure 9:
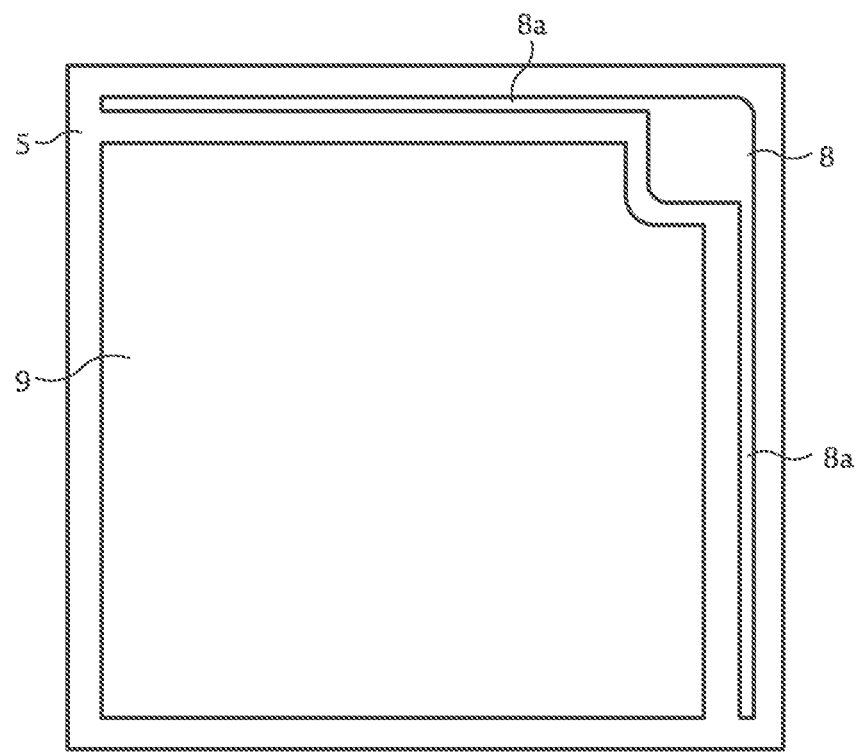

As can be seen in the schematical top view of the p-contact 9 and n-contact 8, which is shown in FIG. 9, the n-contact 8 can have contact strips 8*a* which extend over a part of the surface of the first semiconductor layer 2, for example, along the side edges of the optoelectronic component. The contact strips 8*a* improve the current spreading over the first semiconductor layer 2.

Figure 10:
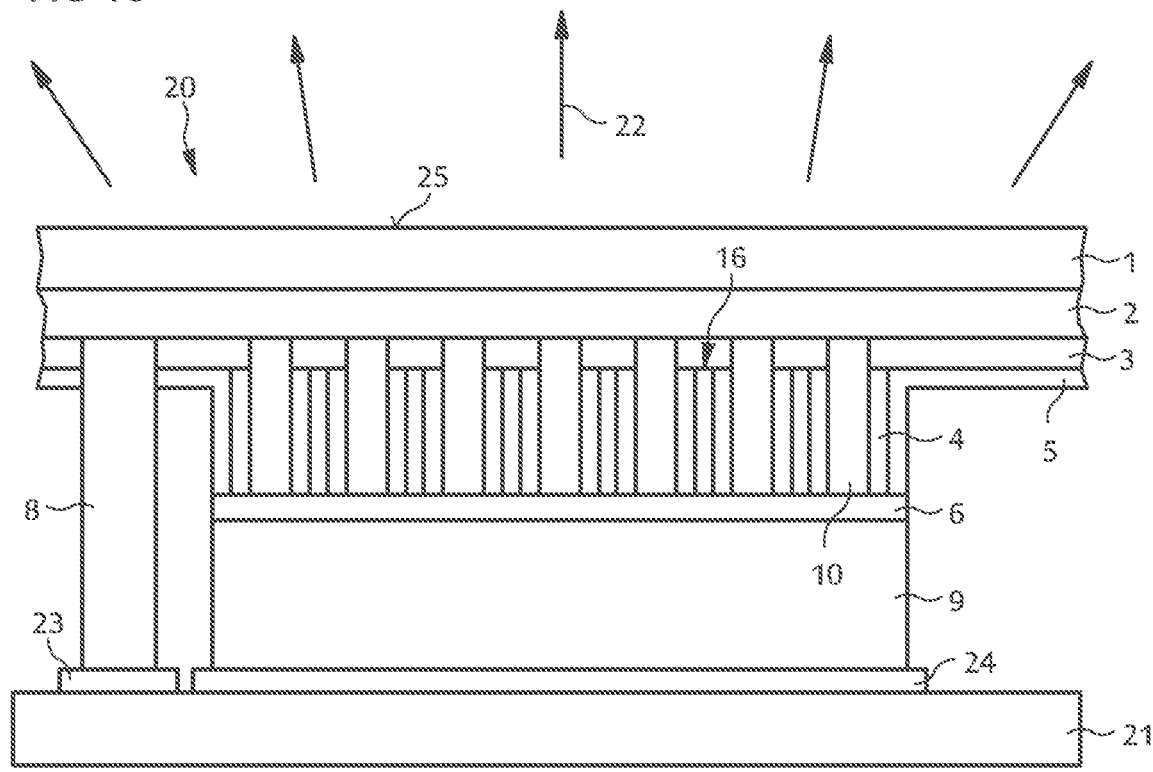
FIG. 10 shows a schematic illustration of a cross section through an optoelectronic semiconductor chip in accordance with a first exemplary embodiment.

FIG. 10 shows a first exemplary embodiment of an optoelectronic semiconductor component 20 that can be produced by the method described in conjunction with FIGS. 1 to 9. In this embodiment, the optoelectronic semiconductor component 20 is a flip-chip type light emitting diode. The light emitting diode emits electromagnetic radiation 22 through the transparent growth substrate 1 which can in particular be a transparent sapphire substrate.

The optoelectronic semiconductor component 20 can be mounted on a carrier 21 which comprises, for example, contact metallizations 23, 24 for making electrical contact with the n-contact 8 and p-contact 9. The carrier 21 may be, for example, a printed circuit board. The radiation exit surface 25 of the optoelectronic component 20 is opposite the carrier 21.

The metal layer 6 is arranged between the p-contact 9 and the active regions 10 and advantageously acts as a mirror layer which reflects radiation emitted in a direction toward the carrier 21 to the radiation exit surface 25. In addition, the metal layer 6 makes electrical contact with the current spreading layers 4 of the active regions 10. In particular, each active region 10 has a separate current spreading layer 4, wherein the current spreading layers 4 are electrically interconnected by the metal layer 6. In other words, the metal layer 6 has the function of current spreading over the whole area of the active regions 10.

The individual current spreading layers 4 of the active regions 10 comprise a transparent conductive oxide and are in each case arranged on the sidewalls 15 of the active regions 10. The current spreading layers 4 have the function of spreading current over the sidewalls 15. However, the current spreading layers 4 on the sidewalls 15 do not have the function of spreading current over the whole area of the active regions 10. Instead, the metal layer 6 is used for this function. For this reason, the current spreading layers 4 can advantageously be very thin. Preferably, the current spreading layers 4 have a thickness of less than 30 nm.

This has the advantage that absorption in the current spreading layers 4 is very low. Furthermore, it is advantageous that regions 16 of the insulation layer 3 between the active regions 10 are at least partly free of the current spreading layer 4. In this way, the absorption of radiation is further reduced.

Figure 11:
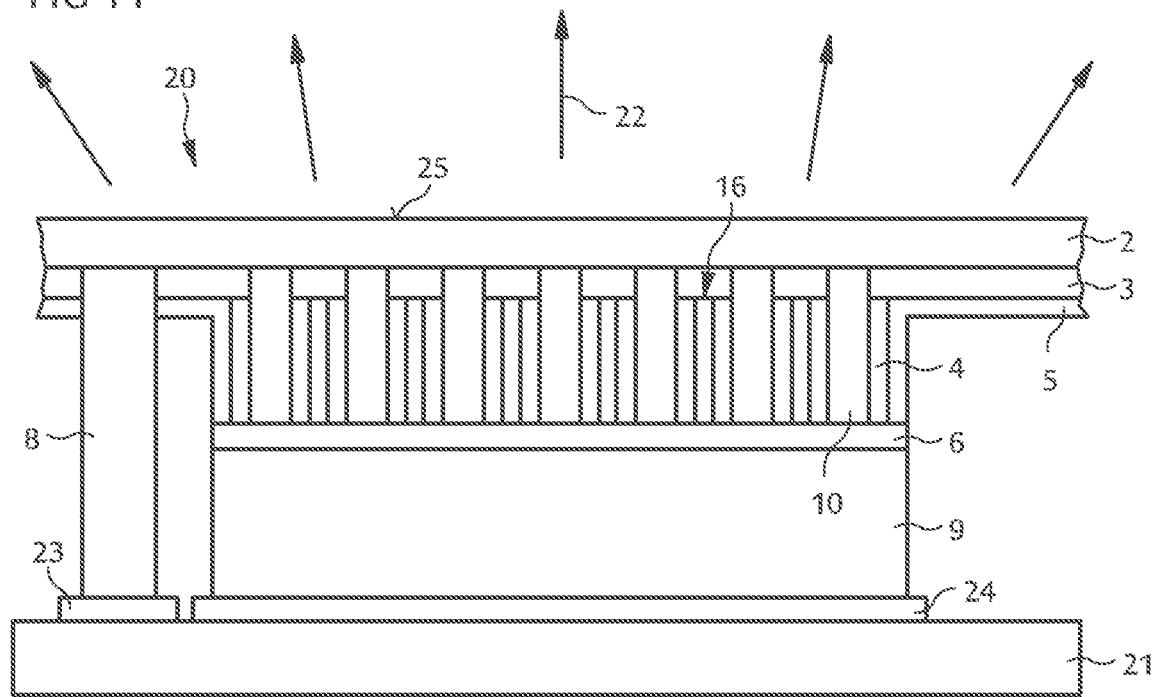
FIG. 11 shows a schematic illustration of a cross section through an optoelectronic semiconductor chip in accordance with a second exemplary embodiment.

FIG. 11 shows a second exemplary embodiment of an optoelectronic semiconductor component 20 that can be produced by the method described in conjunction with FIGS. 1 to 9. The difference with respect to the first exemplary embodiment is that the growth substrate 1 has been removed in a further method step. The removal of the growth substrate 1 can be done, for example, by a Laser-Lift-off process. The same as in the first exemplary embodiment, the main emission direction is reverse to the growth direction of the semiconductor layers. In particular, electromagnetic radiation 22 is emitted through the first semiconductor layer 2. A light emitting semiconductor chip of this type is often referred to as a "thin-film chip". For further improving light extraction, the first semiconductor layer 2 can be roughened and/or thinned.

The description made with reference to the exemplified embodiments does not restrict the invention to these embodiments. Rather, the invention encompasses any new feature and any combination of features, including in particular any combination of features in the claims, even if this feature or this combination is not itself explicitly indicated in the claims or exemplified embodiments.

The invention claimed is:

1. An optoelectronic semiconductor component comprising:
   a plurality of active regions configured to emit electromagnetic radiation,
   wherein the active regions are arranged spaced apart from each other,
   wherein the active regions have a main extension direction,
   wherein each active region has a core region, an active layer covering the core region at least in directions transverse to the main extension direction,
   wherein each active region has a cover layer covering the active layer at least in directions transverse to the main extension direction,
   wherein each active region has a current spreading layer at least partly covering sidewalls of each respective active region,
   wherein each current spreading layer comprises a transparent conductive oxide and is in electrical contact with the cover layer,
   wherein a metal layer directly adjoins parts of the active regions and parts of the current spreading layers,
   wherein the metal layer electrically interconnects the current spreading layers, and
   wherein the metal layer comprises a metal that is suited to form an ohmic contact with the current spreading layers and that is not suited to form an ohmic contact with the core regions.

2. The optoelectronic semiconductor component according to claim 1, wherein each current spreading layer has a thickness of less than 30 nm.

3. The optoelectronic semiconductor component according to claim 1, wherein the current spreading layers of the active regions are separated from one another and are electrically interconnected by the metal layer.

4. The optoelectronic semiconductor component according to claim 1, wherein the metal layer comprises silver.

5. The optoelectronic semiconductor component according to claim 1, further comprising a transparent dielectric layer arranged between the active regions, wherein the transparent dielectric layer, the current spreading layers and the active regions form a planar surface on which the metal layer is located.

6. The optoelectronic semiconductor component according to claim 1, wherein the metal layer is arranged on a side of the active regions facing away from a radiation exit surface of the optoelectronic semiconductor component.

7. The optoelectronic semiconductor component according to claim 1, wherein the optoelectronic semiconductor component comprises an n-contact and a p-contact, and wherein the p-contact is arranged on a side of the metal layer facing away from a radiation exit surface of the optoelectronic semiconductor component.

8. The optoelectronic semiconductor component according to claim 1, wherein the optoelectronic semiconductor component is a flip-chip type light emitting diode chip.

9. The optoelectronic semiconductor component according to claim 1, wherein the optoelectronic semiconductor component is a light emitting diode chip having no growth substrate.

10. The optoelectronic semiconductor component according to claim 1, wherein the active regions are microrods or nanorods having a lateral extent between 20 nm and 5 µm inclusive.

11. A method for producing an optoelectronic semiconductor component according to claim 1, the method comprising:
growing the active regions on a growth substrate;
depositing a current spreading layer on the active regions;
removing the current spreading layer from part of the active regions by etching;
applying a transparent dielectric layer over the active regions and the current spreading layer;
mechanically removing a part of the transparent dielectric layer, a part of the current spreading layer and parts of the active regions so that an exposed surface is formed having exposed parts of the current spreading layer and active regions; and
applying a metal layer on the exposed surface, wherein the metal layer comprises a metal that is suited to form an ohmic contact with the current spreading layers and that is not suited to form an ohmic contact with the core regions.

12. The method according to claim 11, wherein mechanically removing the part of the transparent dielectric layer, the part of the current spreading layer and the part of the active regions comprises polishing.

13. The method according to claim 11, wherein removing the current spreading layer also comprises removing the current spreading layer from regions of an insulation layer between the active regions.

14. The method according to claim 11, further comprising removing the growth substrate.

* * * * *